US008674273B2

(12) United States Patent
Yonenaga et al.

(10) Patent No.: US 8,674,273 B2
(45) Date of Patent: Mar. 18, 2014

(54) HEAT TREATMENT APPARATUS

(75) Inventors: Tomihiro Yonenaga, Nirasaki (JP); Yumiko Kawano, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 241 days.

(21) Appl. No.: 13/040,697

(22) Filed: Mar. 4, 2011

(65) Prior Publication Data
US 2011/0210117 A1 Sep. 1, 2011

Related U.S. Application Data

(63) Continuation of application No. PCT/JP2009/060527, filed on Jun. 9, 2009.

(30) Foreign Application Priority Data

Sep. 4, 2008 (JP) ................................. 2008-226590

(51) Int. Cl.
*H05B 6/10* (2006.01)
*C23C 16/00* (2006.01)

(52) U.S. Cl.
USPC .......................... 219/634; 219/638; 118/723 I

(58) Field of Classification Search
USPC ......... 219/647, 678–680, 685, 701, 702, 704, 219/752, 634, 638, 651–652; 438/12–15, 438/663, 676; 427/545–547, 598; 156/345.52; 118/58, 621–623, 118/641–643, 723 I, 724, 725
See application file for complete search history.

(56) References Cited

U.S. PATENT DOCUMENTS

| 3,980,854 A * | 9/1976 | Berkman et al. ............... 219/634 |
| 4,082,865 A * | 4/1978 | Ban et al. ........................ 427/253 |
| 4,858,557 A * | 8/1989 | Pozzetti et al. ................ 118/725 |
| 6,224,934 B1 * | 5/2001 | Hasei et al. ...................... 427/10 |
| 2006/0127601 A1 * | 6/2006 | Murakami et al. ............. 427/569 |
| 2006/0289409 A1 * | 12/2006 | Choi et al. ............... 219/121.57 |

FOREIGN PATENT DOCUMENTS

| JP | 56-006428 | 1/1981 | |
| JP | 61-091920 | 5/1986 | |
| JP | 63-277779 | 11/1988 | |
| JP | 10-022290 | 1/1998 | |
| JP | 11-016893 | 1/1999 | |
| JP | 11016893 A * | 1/1999 | .......... H01L 21/3065 |
| JP | 2003-017426 | 1/2003 | |
| JP | 2003-068658 | 3/2003 | |
| JP | 2003-100643 | 4/2003 | |
| JP | 2008-034780 | 2/2008 | |

* cited by examiner

*Primary Examiner* — Quang Van
*Assistant Examiner* — Michael Hoang
(74) *Attorney, Agent, or Firm* — Oblon, Spivak, McClelland, Maier & Neustadt, L.L.P.

(57) ABSTRACT

Provided is a heat treatment apparatus which, when simultaneously heating substrates placed on susceptors, is capable of controlling the uniformity of temperature within each substrate. The heat treatment apparatus includes: a reaction tube which performs predetermined treatment to wafers; a plurality of susceptors each of which has a mounting surface for mounting the wafer and is made of a conductive material; a rotatable quartz boat wherein the susceptors spaced apart in a direction perpendicular to the mounting surfaces are arranged and supported in the reaction tube; a magnetic field generating unit which is arranged on a sidewall of the processing chamber and includes a pair of electromagnets which generate an AC magnetic field in a direction parallel to the mounting surfaces of the susceptors and inductively heat the susceptors; and a control unit which controls the AC magnetic field generated by the magnetic field generating unit.

11 Claims, 10 Drawing Sheets

HEAT TREATMENT APPARATUS

This application is a Continuation Application of PCT International Application No. PCT/JP2009/060527 filed on Jun. 9, 2009, which designated the United States.

FIELD OF THE INVENTION

The present invention relates to a heat treatment apparatus for performing a predetermined heat treatment on a substrate, e.g., a semiconductor wafer, a glass substrate or the like.

BACKGROUND OF THE INVENTION

In order to manufacture a semiconductor integrated circuit, various heat treatments such as a film forming process for forming, e.g., a silicon film or a silicon oxide film, an oxidation process and the like are performed on a substrate surface. When the heat treatments are carried out, there is often used a so-called batch type heat treatment apparatus capable of simultaneously processing a plurality of semiconductor wafers (hereinafter, simply referred to as a "wafers").

The batch type heat treatment apparatus employs a method for heating a reaction tube in which a plurality of wafers is accommodated by using an electric furnace (hot wall). However, the method using an electric furnace is disadvantageous in that a long period of time is required to increase or decrease a wafer temperature due to large heat capacity of the entire furnace to thereby decrease productivity remarkably.

In addition, there is known a heat treatment apparatus for heating a wafer through high-frequency induction heating (see, e.g., Japanese Patent Applications Publication Nos. S56-006428 and S61-091920). This heat treatment apparatus generally includes an induction coil externally wound around a reaction tube and supplies a high frequency current to the induction coil, to thereby inductively heat a conductive susceptor provided in the reaction tube. Accordingly, a wafer mounted on the susceptor is indirectly heated by the heat conduction. Since, with such configuration, it becomes unnecessary to directly heat the reaction tube, this can reduce the heat capacity of the susceptor and, thus, the wafer temperature can be increased or decreased at a high speed compared to the case of using an electric furnace. Further, it is possible to control a wall temperature of the reaction tube separately from the wafer temperature as in a so-called cold wall type heat treatment apparatus.

However, if the high frequency induction heating is performed in the cold wall type heat treatment apparatus having a plurality of susceptors of small heat capacity, in-plane temperature uniformity of the susceptors and/or temperature uniformity between the susceptors are deteriorated due to a difference between temperatures of the susceptors and an ambient temperature (e.g., temperatures of inner walls of the reaction tube and the like). Furthermore, temperature uniformity between a plurality of wafers and in-plane temperature uniformity of each wafer may be deteriorated.

As for a method for improving temperature uniformity between wafers, there is disclosed in, e.g., Japanese Patent Application Publication No. 2003-017426 for controlling temperature uniformity between wafers by individually controlling powers supplied to a plurality of induction coils arranged in a lengthwise direction of the reaction tube. Moreover, in, e.g., Japanese Patent Application Publication No. 2003-068658, wafers are arranged between inductively heated dummy heating plates to improve the temperature uniformity.

However, no prior art has disclosed a method for controlling temperature uniformity of each wafer, and there has not yet been known a method for controlling in-plane temperature uniformity of wafers which can be applied to a batch type heat treatment apparatus for processing a plurality of wafers simultaneously.

SUMMARY OF THE INVENTION

In view of the above, the present invention provides a heat treatment apparatus capable of controlling in-plane temperatures of substrates respectively mounted on a plurality of susceptors when the substrates are heated together.

In accordance with an aspect of the present invention, there is provided a heat treatment apparatus including a processing chamber for performing a predetermined process on a plurality of substrates; a plurality of susceptors made of a conductive material and each having a mounting surface for mounting the substrates; a rotatable susceptor supporting unit for supporting the susceptors in the processing chamber, the susceptors being spaced apart from each other in a direction perpendicular to the mounting surfaces; a magnetic field generating unit, provided on a sidewall of the processing chamber, for inductively heating the susceptors by generating an AC magnetic field in a direction parallel to the mounting surfaces; and a control unit for controlling the AC magnetic fields generated by the magnetic field generating unit.

The magnetic field generating unit may generate the magnetic field in the direction parallel to the substrate mounting surfaces of the susceptors, i.e., the direction parallel to the substrate surfaces, while rotating the substrates together with the susceptors by the susceptor supporting unit. Thus, the in-plane temperatures of the susceptors can be controlled by adjusting the AC magnetic field generated in the direction parallel to the substrates by the control unit. Accordingly, it is possible to control the in-plane temperatures of the substrates mounted on the susceptors.

Moreover, the susceptors may be made of a conductive material having a large resistivity, and the sidewall of the processing chamber may be made of a material having a resistivity smaller than that of the susceptors, so that the susceptors can be selectively inductively heated. As a consequence, it is possible to control the sidewall temperature separately from the wafer temperature by using another heating unit. In that case, even if a temperature difference occurs between the susceptors and peripheral parts thereof, the in-plane temperature uniformity of the wafers can be maintained by controlling the in-plane temperatures of the susceptors.

The magnetic field generating unit may have a pair of electromagnets formed by winding induction coils around cores each having two magnetic poles, and AC power sources for independently applying AC currents to the induction coils of the electromagnets; the electromagnets may be installed on a pair of opposite sidewalls of the processing chamber, and two pole faces of one of the electromagnets and two pole faces of the other electromagnet may be separately arranged to face each other with peripheral portions of the susceptors therebetween; and the control unit may independently control the AC currents applied to the induction coils of the electromagnets by adjusting the AC power sources.

Thus, the directions of the magnetic fluxes can be changed so as to weaken or strengthen the magnetic fluxes at the central portions of the susceptors in accordance with the phases of the AC currents supplied to the induction coils of the electromagnets. Accordingly, it is possible to control the induced currents at the peripheral portions with respect to the central portions of the susceptors and the heat generation rates (heat values) at those portions, and this enables the in-plane temperatures of the susceptors and those of the substrates mounted on the susceptors to be controlled.

The magnetic field generating unit may have a pair of electromagnets formed by winding induction coils around cores each having two magnetic poles, and AC power sources for applying AC currents to the induction coils of the electromagnets independently; the electromagnets may be provided to surround a pair of opposite sidewalls of the processing chamber, and two pole faces of one of the electromagnets and two pole faces of the other electromagnet may be separately arranged to face each other with peripheral portions of the susceptors therebetween; and the control unit may independently control the AC currents applied to the induction coils of the electromagnets by adjusting the AC power sources.

Therefore, the directions of the magnetic fluxes can be changed so as to weaken or strengthen the magnetic fluxes at the central portions of the susceptors in accordance with the phases of the AC currents supplied to the induction coils of the electromagnets. Hence, it is possible to control the induced currents at the peripheral portions with respect to the central portions of the susceptors and the heat generation rates at those portions, and this enables the in-plane temperatures of the susceptors and those of the substrates mounted on the susceptors to be controlled.

The control unit may control in-plane temperature distribution of the susceptors by switching control for supplying in-phase AC currents from the AC power sources to the pair of electromagnets and control for supplying anti-phase (reverse phase) AC currents from the AC power sources to the pair of electromagnets.

When the in-phase AC currents are supplied to the pair of electromagnets, the magnetic fluxes become weakened at the central portions of the susceptors and, thus, the temperatures of the peripheral portions can be controlled to be higher than those of the central portions. On the other hand, when the anti-phase AC currents are supplied to the pair of electromagnets, the magnetic fluxes become strengthened at the central portions of the susceptors and, hence, the temperatures of the peripheral portions can be controlled to be lower than those of the central portion. By switching the phase controls temporally, it is possible to vary the distribution of the in-plane temperatures of the susceptors, and also possible to satisfactorily control the distribution of the in-plane temperatures of the substrates mounted on the susceptors.

The magnetic field generating unit may be arranged in a plural number at multiple stages along an arrangement direction of the susceptors and the substrates.

By controlling a pair of electromagnets of the respective magnetic field generating units independently, it is possible to control the distribution of the in-plane temperatures of the susceptors and the temperature distribution in the arrangement direction of the susceptors.

The susceptors may be made of graphite as an example, and the sidewall of the processing chamber may be made of a non-ferrous metal material. Moreover, the sidewall of the processing chamber may be made of an aluminum-based non-ferrous metal material. Thus, the sidewalls of the processing chamber are hardly inductively heated, and the susceptors can be selectively inductively heated.

The cores of the electromagnets may be made of a ceramic material, and the cores of the electromagnets may be made of a ferrite-based ceramic material. Accordingly, the heat generation of the core can be prevented, and this can prevent the sidewalls of the processing chamber from being heated by the core.

The apparatus may further include a gas supply unit for supplying a processing gas into the processing chamber; and a gas exhaust mechanism for vacuum-exhausting the processing chamber. The processing chamber may perform a heat treatment on the substrates each having a metal film thereon or for forming a metal film on each of the substrates. The magnetic fields are generated in the direction parallel to the mounting surfaces of the susceptors by the magnetic field generating units, i.e., the direction parallel to the substrate surfaces, so that the magnetic fluxes hardly flow through the metal film having an extremely thin thickness compared to that of the susceptor. For that reason, even when heat treatment is performed on a substrate having a metal film thereon or heat treatment for forming a metal film on a substrate is carried out, the metal film is not inductively heated. Hence, the in-plane temperatures of the wafers can be controlled only by thermal conduction from the susceptors.

In accordance with the present invention, when the substrates mounted on the susceptors are heated at the same time, the susceptors are inductively heated by generating AC magnetic fields in a direction parallel to the mounting surfaces of the susceptors. Therefore, the distribution of the in-plane temperatures of the susceptors can be variable. Accordingly, it is possible to control the distribution of the in-plane temperatures of the substrates mounted on the susceptors.

DETAILED DESCRIPTION OF THE EMBODIMENTS

Figure 1:
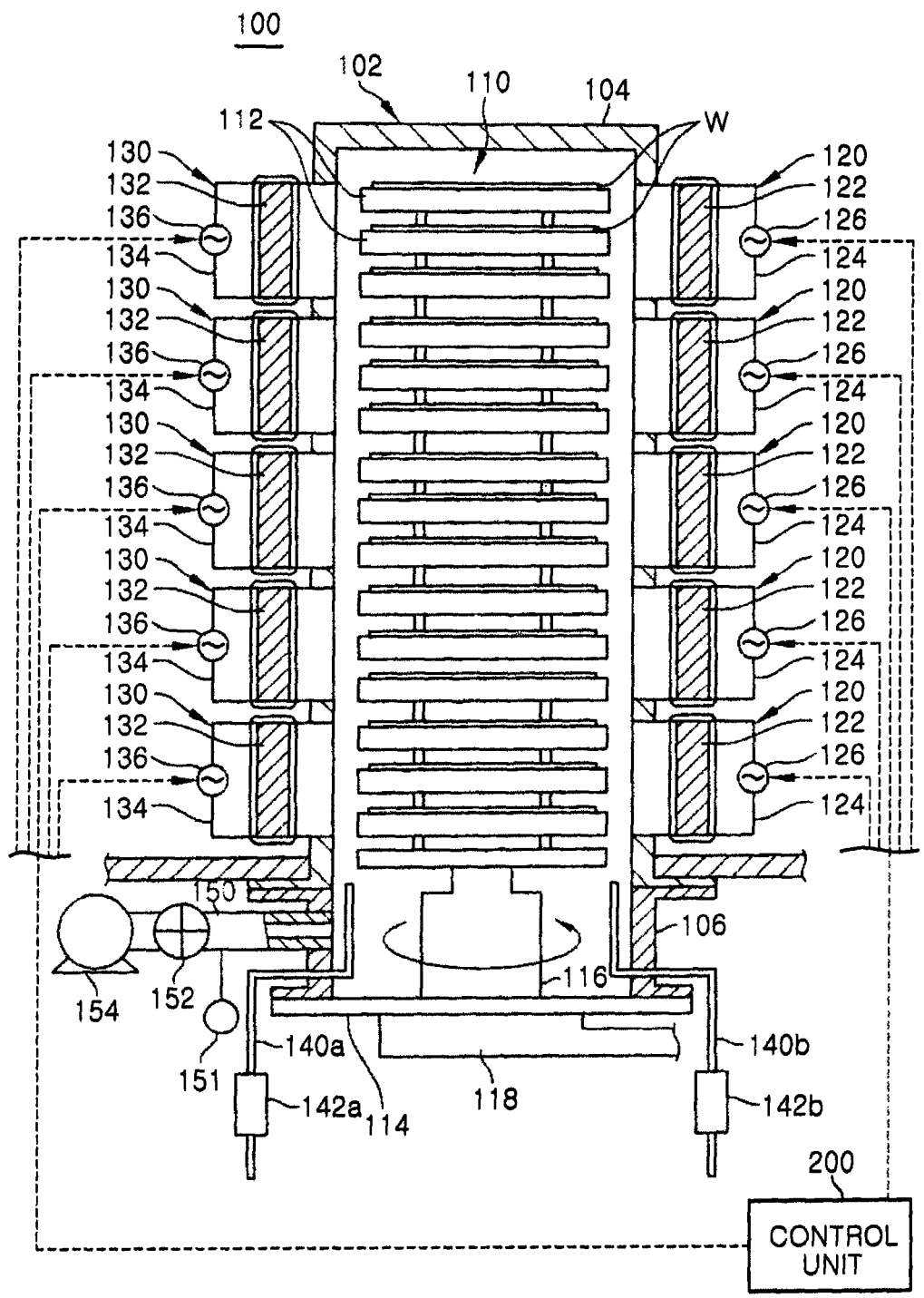
FIG. 1 is a cross sectional view showing a schematic configuration of a heat treatment apparatus in accordance with an embodiment of the present invention.

The embodiments of the present invention will be described with reference to the accompanying drawings which form a part hereof. Throughout this specification and the drawings, like reference numerals designate like parts having substantially identical functions, and redundant description thereof will be omitted.

(Configuration Example of Substrate Processing Apparatus)

Figure 2:
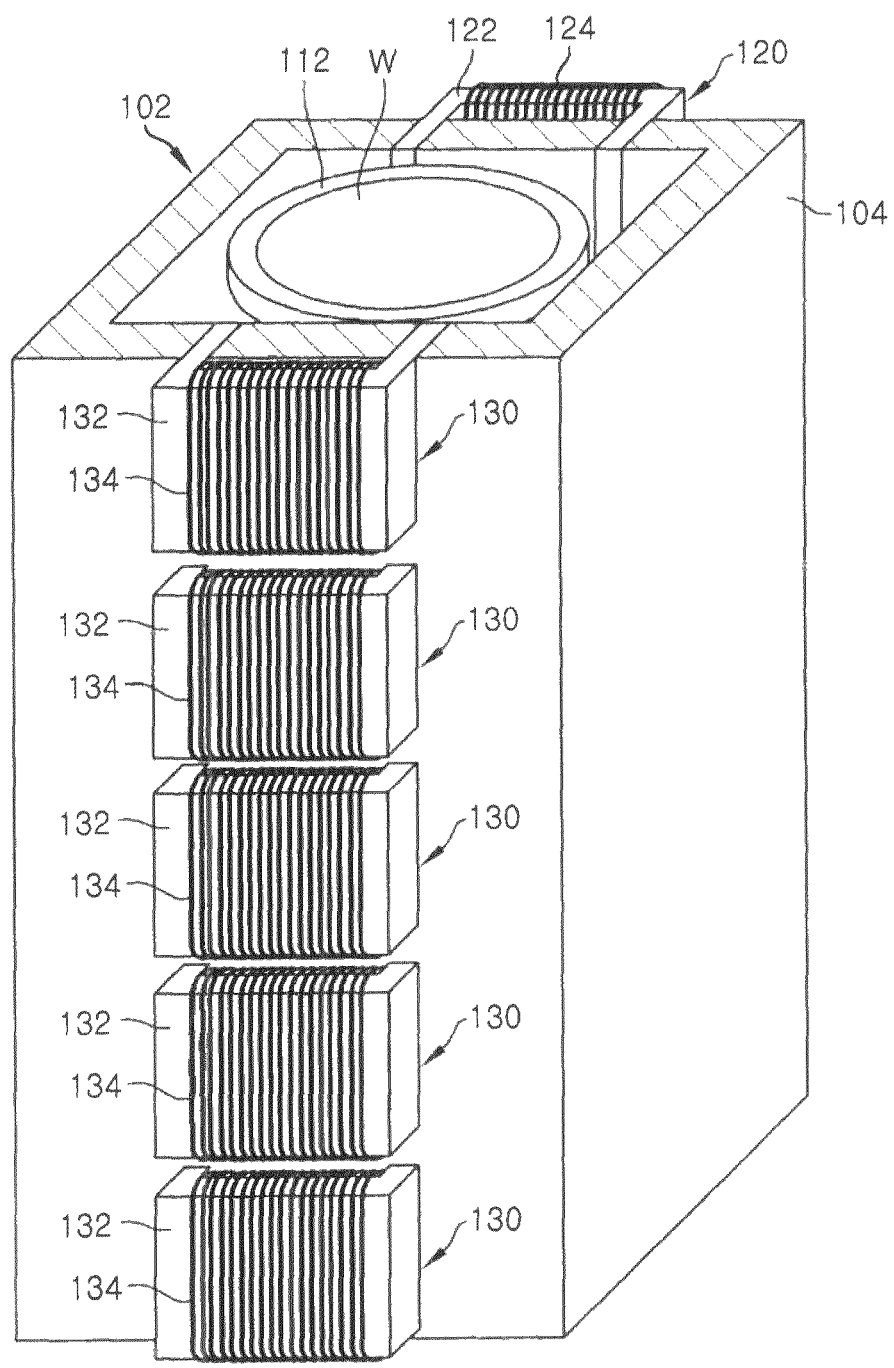
FIG. 2 provides a perspective view schematically describing an exterior configuration of the heat treatment apparatus shown in FIG. 1.

First, a substrate processing apparatus applied to a substrate processing system in accordance with an embodiment of the present invention will be described. Here, a batch type vertical heat treatment apparatus (hereinafter, simply referred to as a "heat treatment apparatus") capable of performing a heat treatment on a plurality of target substrates to be processed, e.g., semiconductor wafers at the same time will be described as an example of a substrate processing apparatus with reference to the drawings. FIG. 1 is a cross sectional view showing a configuration example of the heat treatment apparatus, and FIG. 2 provides a perspective view schematically depicting an outer configuration of the heat treatment apparatus, which is obtained by cutting the ceiling and the bottom of a reaction tube horizontally.

As shown in FIG. 1, a heat treatment apparatus 100 includes a processing chamber 102 for processing a wafer W. The processing chamber 102 has a quadrangular column-shaped reaction tube 104 with its lower end open and a quadrangular column-shaped manifold 106 installed to extend from the lower end of the reaction tube 104. The reaction tube 104 has its ceiling and is airtightly coupled at its bottom to an upper end of the manifold 106. An open lower end of the manifold 106 is freely openable and closable by a cover 114.

Provided on the cover 114 is a quartz boat 110 serving as a susceptor supporting unit for supporting a plurality of susceptors 112 having mounting surfaces for wafers W in the reaction tube 104. The cover 114 is provided on a boat elevator 118 for loading and unloading the quartz boat 110 into and from the reaction tube 104. At its uppermost position, the cover 114 serves to close a lower opening of the processing chamber 102 formed by the manifold 106 and the reaction tube 104.

In the quartz boat 110, the susceptors 112 are horizontally arranged in a shelf shape while being spaced apart from each other at a regular interval in a direction perpendicular to the mounting surface (vertical direction in the present embodiment). A single wafer is mounted on the mounting surface (top surface) of each susceptor 112.

The quartz boat 110 is supported by the cover 114 so as to be rotatable about a vertical axis of the cover 114 via a cylindrical heat insulating body 116. To be specific, a motor (not shown) is connected to, e.g., a lower portion of the heat insulating body 116. By driving the motor and thus rotating the quartz boat 110, the susceptors 112 can be rotated together with the wafers W about the vertical axis.

Moreover, the wafers W accommodated in a cassette container (not shown) are respectively transferred to and mounted on the susceptors 112 by a transfer device (not shown). Further, the quartz boat 110 is loaded into the reaction tube 104 by the boat elevator 118 to thereby process the wafers W. Upon completion of the processing of the wafers W, the quartz boat 110 is unloaded from the reaction tube 104 by the boat elevator 118, and the wafers W on the susceptors 112 are returned to the cassette container by the transport device.

Further, a temperature sensor, e.g., a thermocouple or the like, is provided at each of the susceptors 112, so that a control unit 200 to be described later can detect temperatures of the susceptors 112 by using the temperature sensors. Hence, magnitudes of AC currents to be supplied to induction coils 124 and 134 can be controlled in accordance with the temperatures of the susceptors 112.

Provided on a sidewall of the reaction tube 104 is a plurality of magnetic field generating units, each having a pair of electromagnets 120 and 130 which generate horizontal magnetic fields for inductively heating the susceptors 112 in the reaction tube 104. The magnetic field generating units are arranged at multiple stages along the lengthwise direction of the reaction tube 104. As can be seen from FIGS. 1 and 2, each of the magnetic field generating units has the pair of electromagnets 120 and 130 facing each other with several (e.g., about two to five) susceptors 112 therebetween. FIGS. 1 and 2 show a specific example in which five magnetic field generating units are arranged along the vertical direction of the reaction tube 104.

The number of arranged stages of the magnetic field generating units is not limited to that shown in FIGS. 1 and 2, and may be determined in accordance with a vertical size of the reaction tube 104 or the number of wafers arranged in the vertical direction.

The electromagnets 120 and 130 included in a single magnetic field generating unit are formed by winding the induction coils 124 and 134 around U-shaped cores 122 and 132 each having two magnetic poles. Predetermined AC currents are respectively supplied from AC power sources 126 and 136 to the induction coils 124 and 134. Each of the AC power sources 126 and 136 is connected to the control unit 200.

The control unit 200 can control the AC currents (e.g., magnitude or phase) supplied to the induction coils 124 and 134 independently by controlling the AC power sources 126 and 136. Therefore, magnitudes or directions of horizontal magnetic fields generated in the reaction tube 104 can be controlled. Configurations of the electromagnets 120 and 130 and the horizontal magnetic fields generated by the electromagnets 120 and 130 will be described in detail later.

The manifold 106 has a plurality of gas supply lines 140a and 140b serving as gas supply units for supplying, e.g., $TiCl_4$ gas, $NH_3$ gas, Ar gas and the like into the processing chamber 102. The gas supply lines 140a and 140b are respectively provided with flow rate controllers 142a and 142b such as mass flow controllers (MFC) for controlling gas flow rates or the like. Although FIG. 1 shows an example in which two types of gases are independently supplied from the gas supply lines 140a and 140b, the configuration of the gas supply units is not limited to that of FIG. 1. For example, three or more gas supply lines may be provided so as to supply three or more types of gases independently.

The manifold 106 is connected to a gas exhaust mechanism such as a vacuum pump 154 or the like through a gas exhaust line 150 for exhausting a gas in the reaction tube 104. For example, a pressure control unit 152 for controlling the pressure in the reaction tube 104 is provided in the gas exhaust line 150. The pressure control unit 152 has, e.g., a combination valve, a butterfly valve, a valve driving unit and the like.

Further, the gas exhaust line 150 is provided with a pressure sensor 151 for feedback-controlling the pressure control unit 152 by detecting the pressure in the processing chamber 102. As for the pressure sensor 151, it is preferable to use a capacitive vacuum gauge (capacitance manometer) which is hardly affected by variation in an external pressure.

Each unit in the heat treatment apparatus 100 is controlled by the control unit 200. The control unit 200 controls the units based on processing recipe data including processing conditions such as a set pressure, a set temperature of a heater, a gas flow rate and the like in accordance with a type of a thin film to be formed, a film thickness thereof and the like, for example. Moreover, the control unit 200 receives pressure detection signals from, e.g., the pressure sensor 151 and controls the pressure control unit 152, the flow rate controllers 142a and 142b and the like based on the detection signals.

(Configuration Example of Control Unit)

Figure 3:
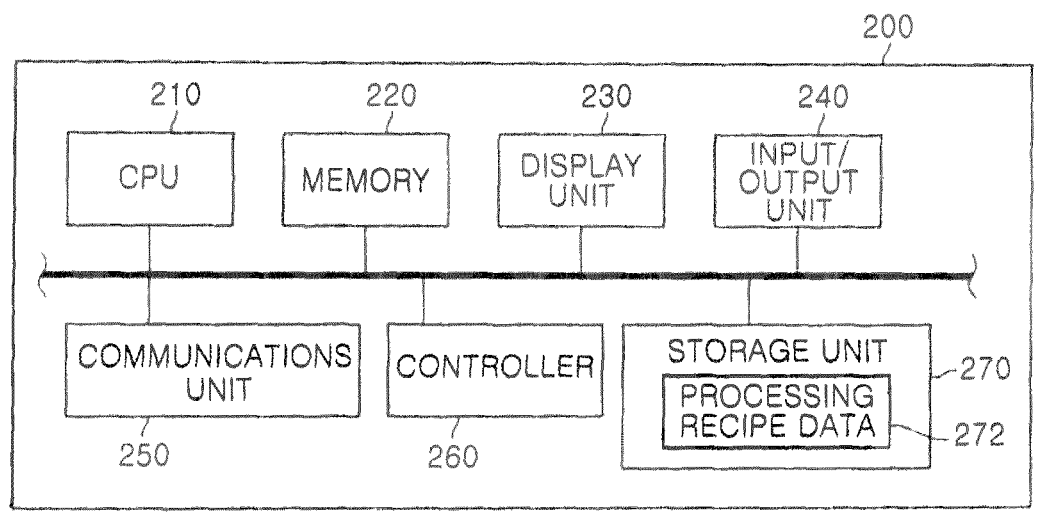
FIG. 3 presents a block diagram describing a configuration example of a control unit shown in FIG. 1.

A configuration example of the control unit 200 will be described with reference to FIG. 3. FIG. 3 is a block diagram showing the configuration example of the control unit 200. As illustrated in FIG. 3, for example, the control unit 200 includes a CPU (central processing unit) 210; a memory 220 used for various processes of the CPU 210; a display unit 230 formed of a liquid crystal display or the like for displaying a manipulation screen, a selection screen or the like; an input/output unit 240 containing an operation panel, a keyboard or the like used by an operator to perform various operations, such as input of various data, output of various data to a predetermined storage medium and the like; and a communications unit 250 for exchanging data through a network or the like.

In addition, the control unit 200 further includes various controllers 260 for controlling each unit in the heat treatment apparatus 100, a storage unit 270 containing a hard disk drive (HDD) or the like for storing various programs executed by the CPU 210 or data required to execute the programs and the like. The CPU 210 reads out the programs or the data from the storage unit 270 when necessary.

Various controllers 260 include a temperature controller for controlling temperatures of the susceptors 112 by controlling the AC power sources 126 and 136 in accordance with, e.g., an instruction from the heat treatment apparatus 100, a pressure controller for controlling a pressure in the reaction tube 104, and the like.

The storage unit 270 stores therein processing recipe data (processing condition data) 272 including a plurality of process recipes containing processing conditions such as a set pressure, set temperatures of the susceptors 112, gas flow rates and the like which are prepared in accordance with a type of a thin film to be formed, a film thickness thereof and the like, for example. The heat treatment apparatus 100 reads out a process recipe in accordance with, e.g., a type of film to be formed, a film thickness thereof and the like, from the processing recipe data 272 and performs a film forming process on the wafer W based on the process recipe.

For example, when the film forming process is performed on the wafers W in the reaction tube 104, the wafers W are heated by controlling the temperatures of the susceptors 112 to a predetermined set level. In order to heat the wafers W, the susceptors 112 are inductively heated by supplying predetermined AC currents to the respective induction coils 124 and 134 of the electromagnets 120 and 130 and thus generating horizontal magnetic fields in the reaction tube 104. At that time, the wafers W can be uniformly heated in a circumferential direction by rotating the wafer W together with the susceptors 112 through the wafer boat 110 in the reaction tube 104.

(Specific Configuration of Magnetic Field Generating Unit)

Figure 4:
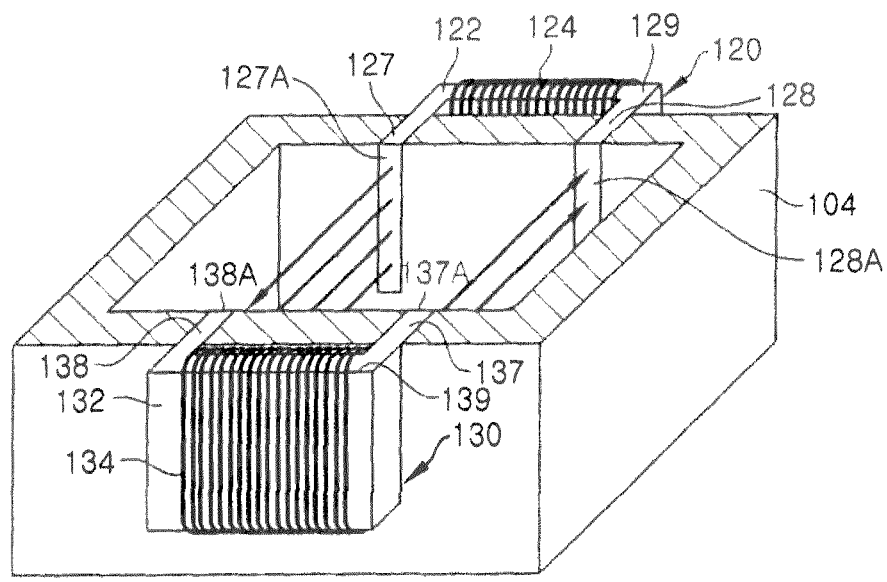
FIG. 4 represents an enlarged fragmentary cross sectional perspective view of a portion where a pair of electromagnets shown in FIG. 2 is installed.

Hereinafter, the magnetic field generating units will be described in detail with reference to FIG. 4. FIG. 4 shows an enlarged perspective view of a portion in which a pair of electromagnets included in a single magnetic field generating unit shown in FIG. 2 is provided. Moreover, FIG. 4 omits illustration of the susceptors 112 and the wafers W. As depicted in FIG. 4, one electromagnet 120 includes the core (magnetic core) 122 formed as a single unit of two magnetic poles 127 and 128 and an intermediate portion 129 for connecting the magnetic poles 127 and 128; and the induction coil 124 wound around the intermediate portion 129. The core 122 is made of a ferromagnetic substance.

In the same manner, the other electromagnet 130 includes the core 132 formed as a single unit of two magnetic poles 137 and 138 and an intermediate portion 139 for connecting the magnetic poles 137 and 138; and the induction coil 134 wound around the intermediate portion 139. The core 132 is made of a ferromagnetic substance. In this way, each of the cores 122 and 132 is formed in, e.g., a U shape (or a left-side open rectangular shape), as shown in FIG. 4.

The electromagnets 120 and 130 are provided at a pair of opposite sidewalls of the reaction tube 104. Two pole faces 127A and 128A (end surfaces of the magnetic poles 127 and 128) of the electromagnet 120 and two pole faces 138A and 137A (end surfaces of the magnetic poles 138 and 137) of the electromagnet 130 are separately arranged to face each other respectively with a peripheral portion of each of the susceptors 112 therebetween.

Specifically, both end portions of the electromagnets 120 and 130 are inserted into holes formed on the sidewalls of the reaction tube 104, so that the pole faces 127A and 128A of the electromagnet 120 can respectively face the pole faces 138A and 137A of the electromagnet 130. Further, in order to suppress heat generation in the cores 122 and 132, the cores 122 and 132 are preferably made of, e.g., a ceramic material, and more preferably made of a ferrite-based ceramic material.

Due to such arrangement of the electromagnets 120 and 130, the directions of the magnetic fluxes generated at the pole faces 127A, 128A, 137A and 138A can be changed in accordance with the phases of the AC currents supplied to the electromagnets 120 and 130, as will be described later.

Further, the pole faces 127A, 128A, 137A and 138A may be placed on same planes as the inner surfaces of the sidewalls of the reaction tube 104 and thus exposed inside the reaction tube 104. In that case, it is preferable to coat, e.g., $Al_2O_3$, on each of the pole faces 127A, 128A, 137A and 138A exposed inside the reaction tube 104 in order to ensure corrosion resistance. Moreover, the pole faces 127A, 128A, 137A and 138A may not be directly exposed inside the reaction tube 104. For example, the pole faces 127A and 128A, and 138A and 137A may respectively face each other with an insulation window (not shown) therebetween, the insulation window being installed at the holes formed on the sidewalls of the reaction tube 104 such that the magnetic fluxes (magnetic force lines) from the pole faces 127A, 128A, 137A and 138A flow through the insulation window. In this way, the pole faces 127A, 128A, 137A and 138A can be disposed without being directly exposed inside the reaction tube 104.

(Horizontal Magnetic Field Generated by Magnetic Field Generation Unit)

Figure 5:
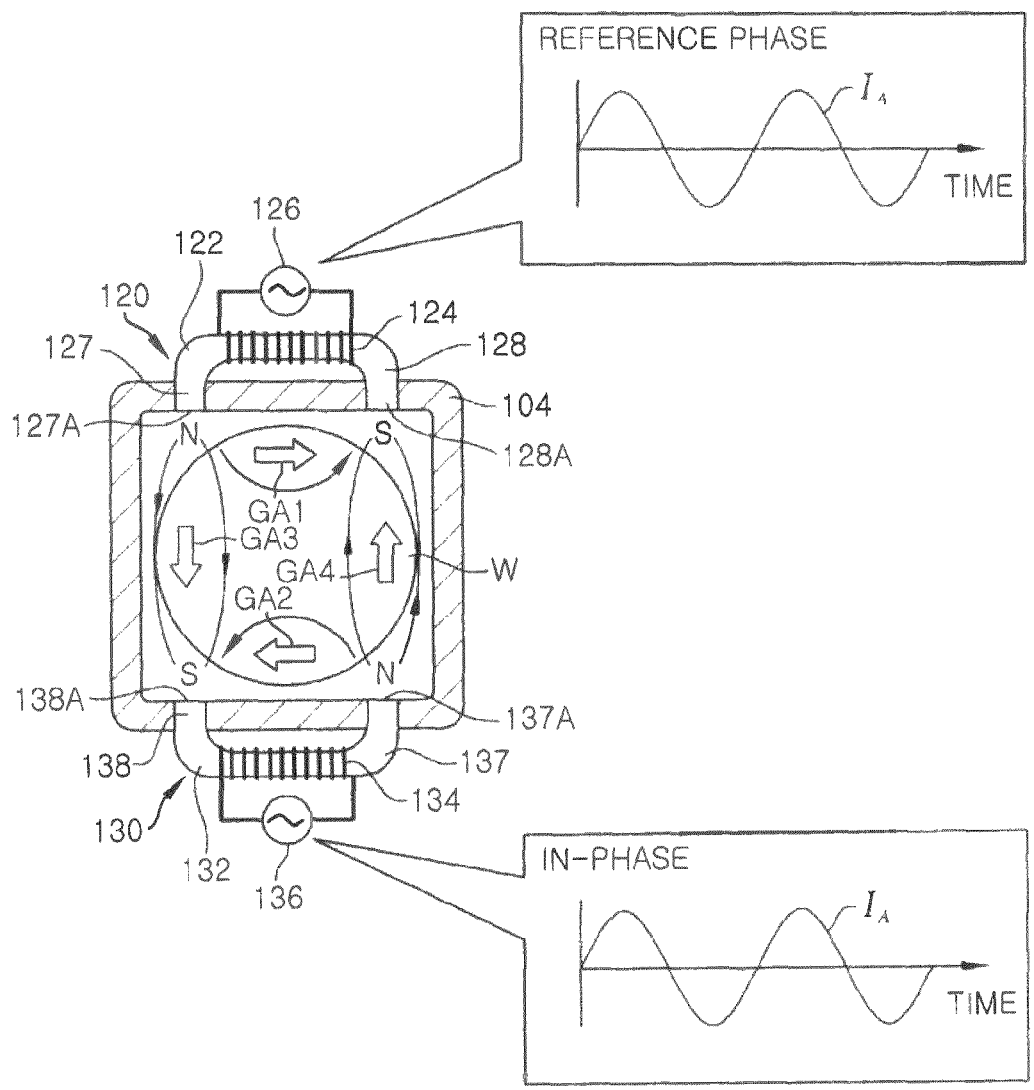
FIG. 5 is an operation explanatory view schematically showing horizontal magnetic fields generated by the electromagnets shown in FIG. 4 in case when in-phase AC currents being supplied to the electromagnets.
Figure 6:
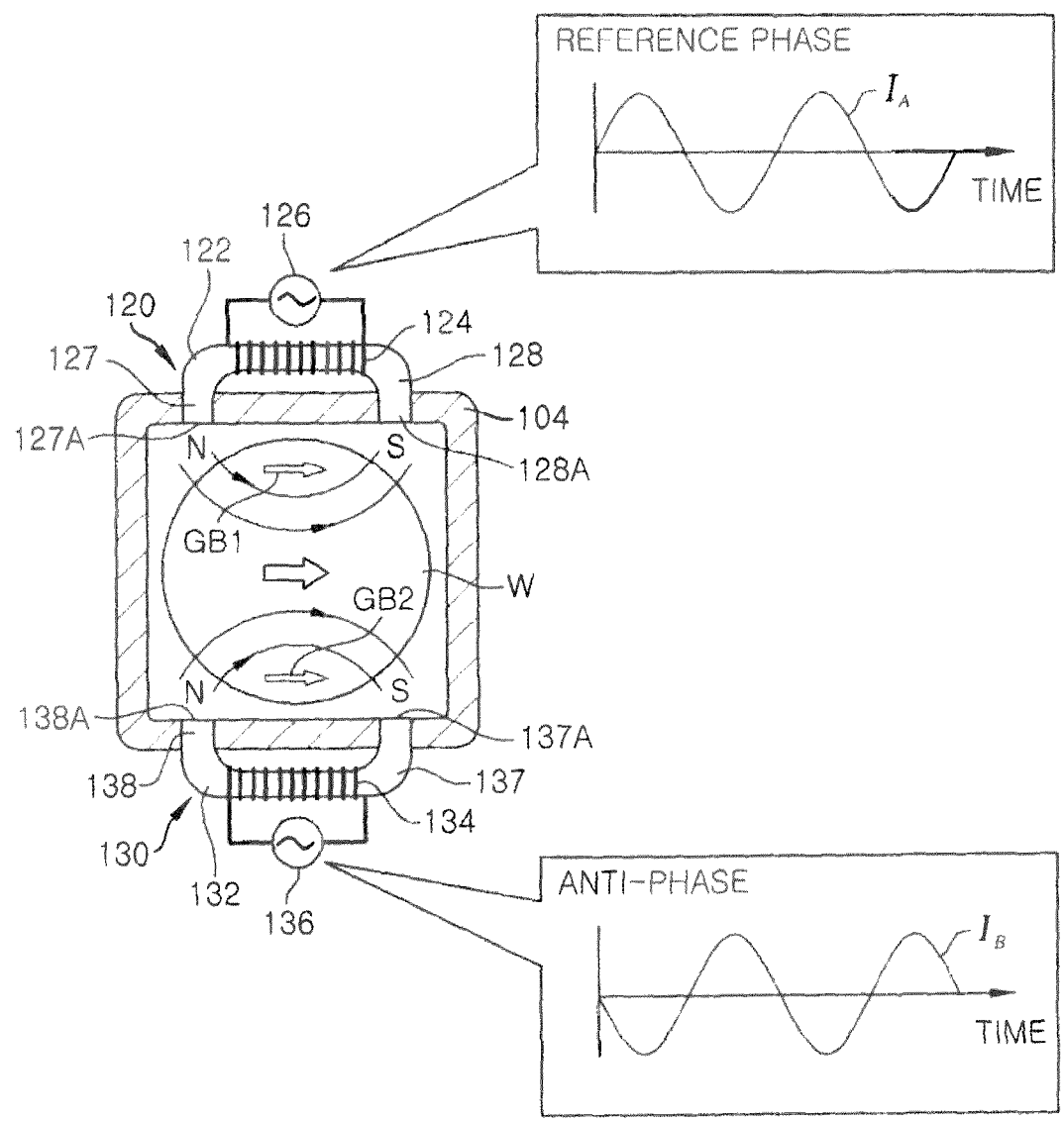
FIG. 6 provides an operation explanatory view schematically showing horizontal magnetic fields generated by the electromagnets shown in FIG. 4 in case when anti-phase AC currents being supplied to the electromagnets.

Hereinafter, the magnetic fields generated by the electromagnets 120 and 130 shown in FIG. 4 which are included in the magnetic field generating unit will be described with FIGS. 5 and 6. FIGS. 5 and 6 are operation explanatory views schematically showing horizontal magnetic fields generated by the magnetic field generating unit, which are top views of the electromagnets 120 and 130 shown in FIG. 4. FIG. 5 schematically shows a certain moment at which a horizontal magnetic field is generated by supplying in-phase AC currents to the electromagnets 120 and 130. FIG. 6 schematically shows a certain moment at which a horizontal magnetic field is generated by supplying anti-phase AC currents to the electromagnets 120 and 130.

As depicted in FIG. 5, an in-phase AC current $I_A$ having the same magnitude as that of an AC current supplied from the AC power source 126 to the induction coil 124 of the electromagnet 120 is supplied to the induction coil 134 of the electromagnet 130. Then, at a certain moment, the magnetic poles 127 and 128 of the electromagnet 120 are respectively magnetized as an N-pole and an S-pole, and the magnetic poles 137 and 138 of the electromagnets 130 are respectively magnetized as an N-pole and an S-pole, as can be seen from FIG. 5.

Accordingly, horizontal magnetic fluxes are generated at the pole faces 127A and 128A of the electromagnet 120 and the pole faces 137A and 138A of the electromagnet 130, and this leads to generation of horizontal magnetic fields in the susceptors 112. In this case, the magnetic fluxes become mutually offset and thus weakened at central portions of the wafers W, so that the horizontal magnetic fields also become weaker at the central portions than those at peripheral portions.

Specifically, at the moment shown in FIG. 5, a magnetic flux GA1 flows from the pole face 127A serving as an N-pole toward the pole face 128A serving as an S-pole in the electromagnet 120, and a magnetic flux GA2 flows from the pole face 137A serving as an N-pole toward the pole face 138A serving as an S-pole in the electromagnet 130. The magnetic fluxes GA1 and GA2 become mutually offset and thus weakened since they flow in the reverse directions to each other at the central portions of the susceptors 112 (central portions of the wafer W). For that reason, the magnetic fields generated by the magnetic fluxes GA1 and GA2 become stronger at the peripheral portions of the susceptors 112 (peripheral portions of the wafers W) than those at the central portions of the susceptors 112.

Similarly, between the electromagnets 120 and 130, a magnetic flux GA3 flows from the pole face 127A serving as an N-pole toward the pole face 138A serving as an S-pole, and a magnetic flux GA4 flows from the pole face 137A serving as an N-pole toward the pole face 128A serving as an S-pole. The magnetic fluxes GA3 and GA4 become mutually offset and thus weakened since they flow in the reverse directions to each other at the central portions of the susceptors 112. Therefore, the magnetic fields generated by the magnetic fluxes GA3 and GA4 become stronger at the peripheral portions of the susceptors 112 than those at the central portions of the susceptors 112.

Herein, the in-phase AC currents $I_A$ are supplied to the electromagnets 120 and 130, so that the magnetic polarities of the magnetic poles 127, 128, 137 and 138 are switched at the same timing. Accordingly, the directions of the magnetic fluxes GA1 to GA4 become reverse to those shown in FIG. 5 at another moment and, thus, the magnetic fluxes GA1 and GA3, and GA2 and GA4 become respectively mutually offset and thus weakened at the central portions of the susceptors 112. For that reason, the magnetic fields are constantly stronger at the peripheral portions of the susceptors 112 than those at the central portions of the susceptors 112.

Accordingly, when, e.g., a film forming process is performed on the wafers W, the film forming rate may be higher at the peripheral portions of the wafers W than that at the central portions of the wafers W. Even when the temperatures of the susceptors 112 are lower at the peripheral portions than those at the central portions since an ambient temperature (e.g., sidewall temperature of the reaction tube 104) of the susceptors 112 is reduced, the heat generation rates at the peripheral portions of the susceptors 112 can be increased compared to those at the central portions of the susceptors 112 by supplying the in-phase AC currents to the electromagnets 120 and 130. The temperature of the peripheral portion of which is easy to be reduced by the effect of the ambient temperature, than that at the central portion thereof. However, a larger amount of heat can be generated at the peripheral portion in each of the susceptors 112 and, thus, the temperatures of the susceptors 112 can be uniform at the central portions and the peripheral portions. Therefore, the in-plane temperature uniformity of the wafers W can be improved.

On the other hand, as shown in FIG. 6, an anti-phase AC current $I_B$ having the same magnitude as that of an AC current $I_A$ supplied from the AC power source 126 to the induction coil 124 of the electromagnet 120 is supplied to the induction coil 134 of the electromagnet 130. Therefore, at a certain moment, the magnetic poles 127 and 128 of the electromagnet 120 are respectively magnetized as an N-pole and an S-pole and the magnetic poles 137 and 138 of the electromagnets 130 are respectively magnetized as an S-pole and an N-pole, as can be seen from FIG. 6.

Hence, horizontal magnetic fluxes are generated at the pole faces 127A and 128A of the electromagnet 120 and the pole faces 137A and 138A of the electromagnet 130, and this leads to generation of horizontal magnetic fields in the susceptors 112. In this case, the magnetic fluxes become mutually superposed and thus strengthened at the central portions of the wafers W, so that the horizontal magnetic fields also become strong at the central portions.

For example, at the moment shown in FIG. 6, a magnetic flux GB1 flows from the pole face 127A serving as an N-pole toward the pole face 128A serving as an S-pole in the electromagnet 120, and a magnetic flux GB2 flows from the pole face 138A serving as an N-pole toward the pole face 137A serving as an S-pole in the electromagnet 130. The magnetic fluxes GB1 and GB2 become mutually superposed and thus strengthened since they flow in the same direction at the central portions of the susceptors 112. Thus, the magnetic fields generated by the magnetic fluxes GB1 and GB2 also become strong at the central portions.

Herein, the anti-phase AC currents $I_A$ and $I_B$ are supplied to the electromagnets 120 and 130, so that the magnetic polarities of the magnetic poles 127, 128, 137 and 138 are switched at the same moment. Hence, the directions of the magnetic fluxes GB1 and GB2 become reverse to those shown in FIG. 6 at another moment and, thus, the magnetic fluxes GB1 and GB2 are constantly strong at the central portions of the susceptors 112. This makes the magnetic fields stronger at the central portions of the susceptors 112 than at the peripheral portions of the susceptors 112. Accordingly, the heat generation rate at the central portions of the wafers W can be increased, and this can increase the temperatures of the central portions of the wafers W.

As such, the in-plane temperature distribution of the susceptors 112 can be varied by temporally switching the phases of the AC currents supplied to the electromagnets 120 and 130 shown in FIGS. 1 and 2 from the same phase to the reverse phase or vise versa and thus changing the time ratio of in-phase current supply time and anti-phase current supply time.

(Specific Example of Wafer Processing Using Heat Treatment Apparatus)

The following description is related to a specific example in which a wafer W is processed by using the heat treatment apparatus 100 of the present embodiment. Herein, there will be described an example in which a metal film, e.g., a TiN film, is formed on a wafer W by using as a source gas a gas obtained by vaporizing a liquid material of a Ti compound (e.g., $TiCl_4$) by a vaporizer. In addition, $NH_3$ gas is used as a nitriding gas together with a source gas.

First, in an initial step, the quartz boat 110 is loaded into the reaction tube 104, the quartz boat 110 accommodating the susceptors 112 to which a plurality of wafers W that has been transferred from cassette containers (not shown). Next, Ar gas as a dilution gas is introduced into the reaction tube 104, and the reaction tube 104 is evacuated such that the pressure in the reaction tube 104 is maintained to a predetermined level (e.g., about 1 Torr). The susceptors 112 are inductively heated by horizontal magnetic fields generated by supplying AC currents to the electromagnets 120 and 130. Thus, the wafers W are heated to and maintained at a predetermined temperature (e.g., about 350° C.). Thereafter, the pressure in the reaction tube 104 is controlled to be maintained at a film forming pressure (e.g., about 0.3 Torr).

In that state, a film forming step is carried out. Specifically, the film forming step is performed by repeating at multiple times (e.g., about 200 times) a first step for introducing a source gas into the reaction tube 104 for a predetermined period of time (e.g., several to ten and several seconds) and vacuum-exhausting the reaction tube 104 or purging the reaction tube 104 with Ar gas for a predetermined period of time (e.g., several to ten and several seconds); and a second step for introducing a nitriding gas into the reaction tube 104 for a predetermined period of time (e.g., several to ten and several seconds) and vacuum-exhausting the reaction tube 104 or purging the reaction tube 104 with Ar gas for a period of time (e.g., several seconds to ten and several seconds).

Then, in a termination step, Ar gas is introduced into the reaction tube 104 while the reaction tube 104 is evacuated, and the supply of the AC currents to the electromagnets 120 and 130 is stopped. Next, the quartz boat 110 is unloaded from the reaction tube 104, and the wafers W are returned to the cassette container (not shown), thereby completing a series of processes. As a result, a TiN film as a metal film, having a thickness of about 10 nm is formed on each wafer W.

During the film forming process, in the heat treatment apparatus 100 of the present embodiment, when the susceptors 112 are inductively heated, it is possible to generate horizontal magnetic fields, i.e., magnetic fields having a direction parallel to the wafer mounting surfaces of the susceptors 112, by the electromagnets 120 and 130 of the magnetic field generating units while rotating the wafers together with the susceptors 112 through the quartz boat 110.

Accordingly, the AC magnetic fields generated by the electromagnets 120 and 130 of the magnetic field generating units can be controlled by adjusting the magnitudes or the phases of the AC currents supplied to the induction coils 124 and 134 by the control unit 200. Therefore, the currents induced on the surfaces of the susceptors 112 and corresponding heat generation rates can be controlled. As a result, it is possible to control the in-plane temperatures of the susceptors 112 and the in-plane temperatures of the wafers W mounted on the susceptors 112.

Each of the magnetic field generating units has a pair of electromagnets 120 and 130 facing each other horizontally with the susceptors 112 therebetween. By independently controlling the AC currents supplied to the induction coils 124 and 134 of the electromagnets 120 and 130, the directions of the magnetic fluxes can be changed so as to mutually offset and thus weaken or superpose and thus strengthen the magnetic fluxes at the central portions of the susceptors 112 in accordance with the phases of the AC currents. Thus, the magnitudes of the induced currents at the peripheral portions with respect to the central portions of the susceptors 112 can be controlled. Accordingly, the in-plane temperatures of the susceptors 112 can be varied by time-divisionally controlling the phases of the AC currents.

Further, the susceptors 112 only can be selectively inductively heated by forming the sidewall of the processing chamber 102, i.e., the sidewall of the reaction tube 104, from a material having a resistivity (electric resistivity) smaller than that of the susceptors 112. Hence, it is possible to control the sidewall temperature of the reaction tube 104 independently of the wafer temperature as in the cold wall type batch heat treatment apparatus. In that case, even if a temperature difference occurs between the susceptors 112 and the surrounding environment, the in-plane temperature uniformity of the wafers can be maintained by controlling the in-plane temperatures of the susceptors 112.

However, when a thin film such as the aforementioned metal film is formed on each wafer W, the magnetic fluxes may flow through the metal film on the wafer W, which inductively heats the metal film on the wafer W. If the temperature of the metal film increases excessively, it is difficult to control the temperature of the wafer W by the heat transfer from the susceptor 112. The induced electromotive force generated in a conductive material such as a metal or the like is in proportion to the temporal differentiation of the magnetic fluxes which flow through the conductive material, and these magnetic fluxes are in proportion to an area of the conductive material which is at right angles to the magnetic field.

Therefore, for example, when the heat treatment apparatus has a conventional configuration in which the magnetic fluxes vertically flow through the reaction tube having an induction coil wound externally therearound, the area of the metal film on the wafer W through which the magnetic fluxes vertically flow is increased remarkably. In that case, it is difficult to neglect the temperature increase caused by the induction heating of the metal film on the wafer W, and this directly affects the temperature of the wafer W.

On the contrary, in the present embodiment, the magnetic fluxes hardly flow through the metal film having an extremely thin thickness (e.g., about 10 to 100 nm) compared to a thickness of the susceptor 112 (e.g., about 1 to 10 mm). This is because a magnetic field is generated in a direction parallel to the mounting surface of the susceptor 112, i.e., a horizontal direction parallel to the surface of the wafer W. Thus, induced electromotive force is not generated at the metal film on the wafer W and, thus, the metal film is not inductively heated. Accordingly, since the temperature of the wafer W conforms to the temperature of the susceptor 112, a film forming process can be satisfactorily performed even when a thin metal film is formed on the wafer W.

Further, the heat generation rate of the conductive material that is heated by induction heating is in proportion to a square root of the resistivity of the conductive material. Therefore, even if the magnetic fluxes are same, the heat generation rate by the induction heating increases as the resistivity of the conductive material increases, and decreases as the resistivity of the conductive material decreases. For that reason, the heat generation rate caused by the induction heating can be controlled by properly selecting the conductive material.

In this regard, when the horizontal magnetic fields are generated at the susceptors 112 by the magnetic field generating units as in the present embodiment, some of the magnetic fluxes leak and reach the sidewalls of the reaction tube 104 as well as the susceptors 112. If the sidewalls of the reaction tube 104 are made of a metal having a relatively large resistivity (e.g., iron, stainless steel, nickel or the like), the sidewalls of the reaction tube 104 are inductively heated by the leaking magnetic flux. If the sidewalls of the reaction tube 104 are heated, it is difficult to control the sidewall temperature of the reaction tube by using another heating unit independently of the wafer temperature.

In the present embodiment, however, the susceptors 112 only can be selectively inductively heated without heating the sidewalls of the reaction tube 104 by selecting the materials forming the susceptors 112 and the sidewalls of the reaction tube 104 such that the resistivity of the susceptors 112 is greater than that of the sidewalls of the reaction tube 104. Preferably, the susceptors 112 are made of a material having a large resistivity, e.g., a conductive material, such as graphite, amorphous carbon, SiC or the like, and the sidewalls of the reaction tube 104 are made of a material having a small resistivity, e.g., a non-ferrous metal such as aluminum or the like. Thus, the sidewalls of the reaction tube 104 can be prevented from being heated by the leaking magnetic flux, and the above problem can be avoided.

(Modification of Magnetic Field Generating Unit)

Figure 7:
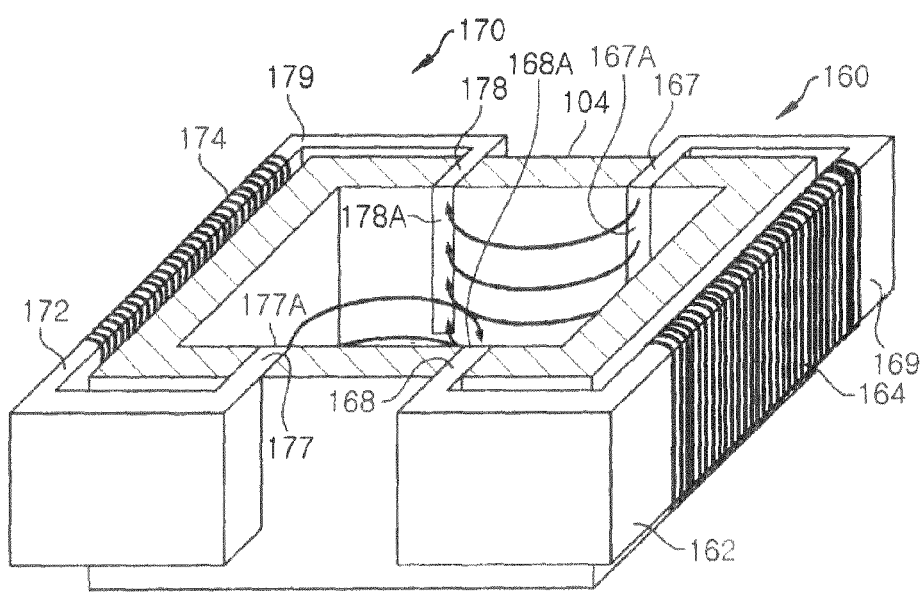
FIG. 7 is a fragmentary cross sectional perspective view depicting a schematic configuration of a magnetic field generating unit in accordance with a modification of the embodiment.

Hereinafter, a modification of the magnetic field generating unit of the present embodiment will be described with reference to FIG. 7. FIG. 7 corresponding to FIG. 4 is an enlarged perspective view showing a portion where a pair of electromagnets is installed. Moreover, FIG. 7 omits the illustration of the susceptors 112 and the wafers W. In the magnetic field generating unit shown in FIG. 7, one electromagnet 160 includes a core 162 formed as a single unit of two magnetic poles 167 and 168 and an intermediate portion 169 for connecting the magnetic poles 167 and 168; and an induction coil 164 wound around the intermediate portion 169. The core 162 is made of a ferromagnetic substance.

In the same manner, the other electromagnet 170 includes a core 172 formed as a single unit of two magnetic poles 177 and 178 and an intermediate portion 179 for connecting the magnetic poles 177 and 178; and an induction coil 174 wound around the intermediate portion 179. The core 172 is made of a ferromagnetic substance. Each of the cores 162 and 172 is formed in, e.g., a C shape, as shown in FIG. 7.

The electromagnets 160 and 170 are respectively provided so as to surround a pair of opposite sidewalls of the reaction tube 104. Two pole faces 167A and 168A (end surfaces of the magnetic poles 167 and 168) of the electromagnet 160 are separately arranged to face each other with the peripheral portions of the susceptors 112 therebetween, and two pole faces 177A and 178A (end surfaces of the magnetic poles 177 and 178) of the electromagnet 170 are separately arranged to face each other with the peripheral portions of the susceptors 112 therebetween.

Specifically, for example, the pole faces 167A and 168A of the electromagnet 160 face each other, and the pole faces 178A and 177A of the electromagnet 170 face each other. Further, the positional relationship of the pole faces 167A, 168A, 177A and 178A shown in FIG. 7 is the same as those of the pole faces 128A, 137A, 127A and 138A shown in FIG. 4. Moreover, in order to suppress heat generation in the cores 162 and 172, the cores 162 and 172 are preferably made of, e.g., a ceramic material, and more preferably made of a ferrite-based ceramic material.

By arranging the electromagnets 160 and 170 in this way, the directions of the magnetic fluxes generated at the pole faces 167A, 168A, 177A and 178A can be changed in accordance with the phases of the AC currents supplied to the electromagnets 160 and 170, as will be described later.

Further, the pole faces 167A, 168A, 177A and 178A may be placed on same planes as the inner surfaces of the sidewalls of the reaction tube 104 and thus exposed inside the reaction tube 104. In that case, it is preferable to coat, e.g., $Al_2O_3$, on each of the pole faces 167A, 168A, 177A and 178A exposed inside the reaction tube 104 in view of corrosion resistance. In addition, for example, the pole faces 167A and 168A, and 178A and 177A may respectively face each other with an insulation window therebetween, the insulation window being installed at the holes formed on the sidewalls of the reaction tube 104 such that the magnetic fluxes (magnetic force lines) from the pole faces 167A, 168A, 177A and 178A flow through the insulation window. Hence, the pole faces 167A, 168A, 177A and 178A can be disposed without being directly exposed inside the reaction tube 104, which prevents corrosion.

(Horizontal Magnetic Field Generated by Magnetic Field Generation Unit in Accordance with Modification)

Figure 8:
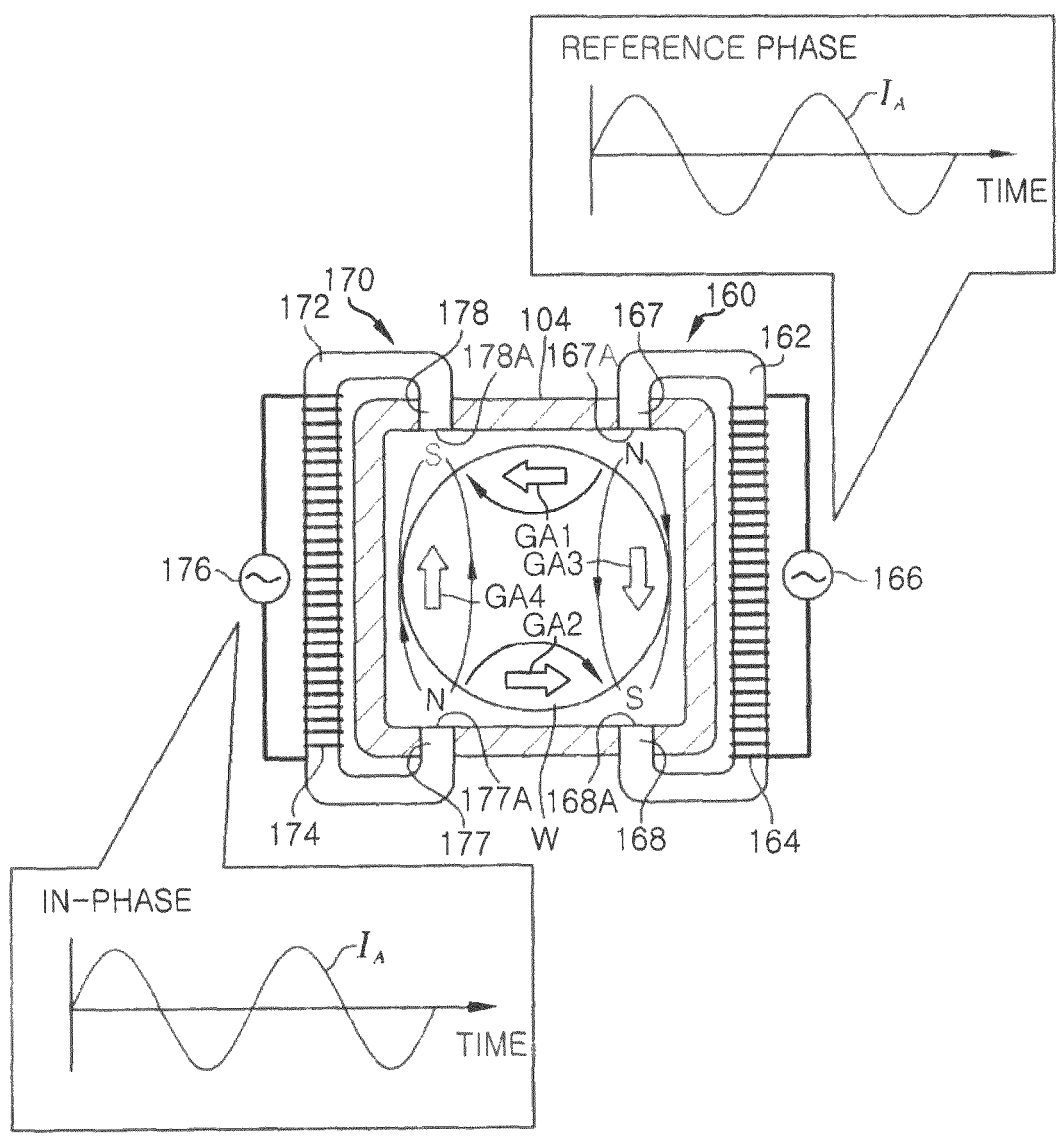
FIG. 8 presents an operation explanatory view schematically showing horizontal magnetic fields generated by a pair of electromagnets shown in FIG. 7 in case when in-phase AC currents being supplied to the electromagnets.
Figure 9:
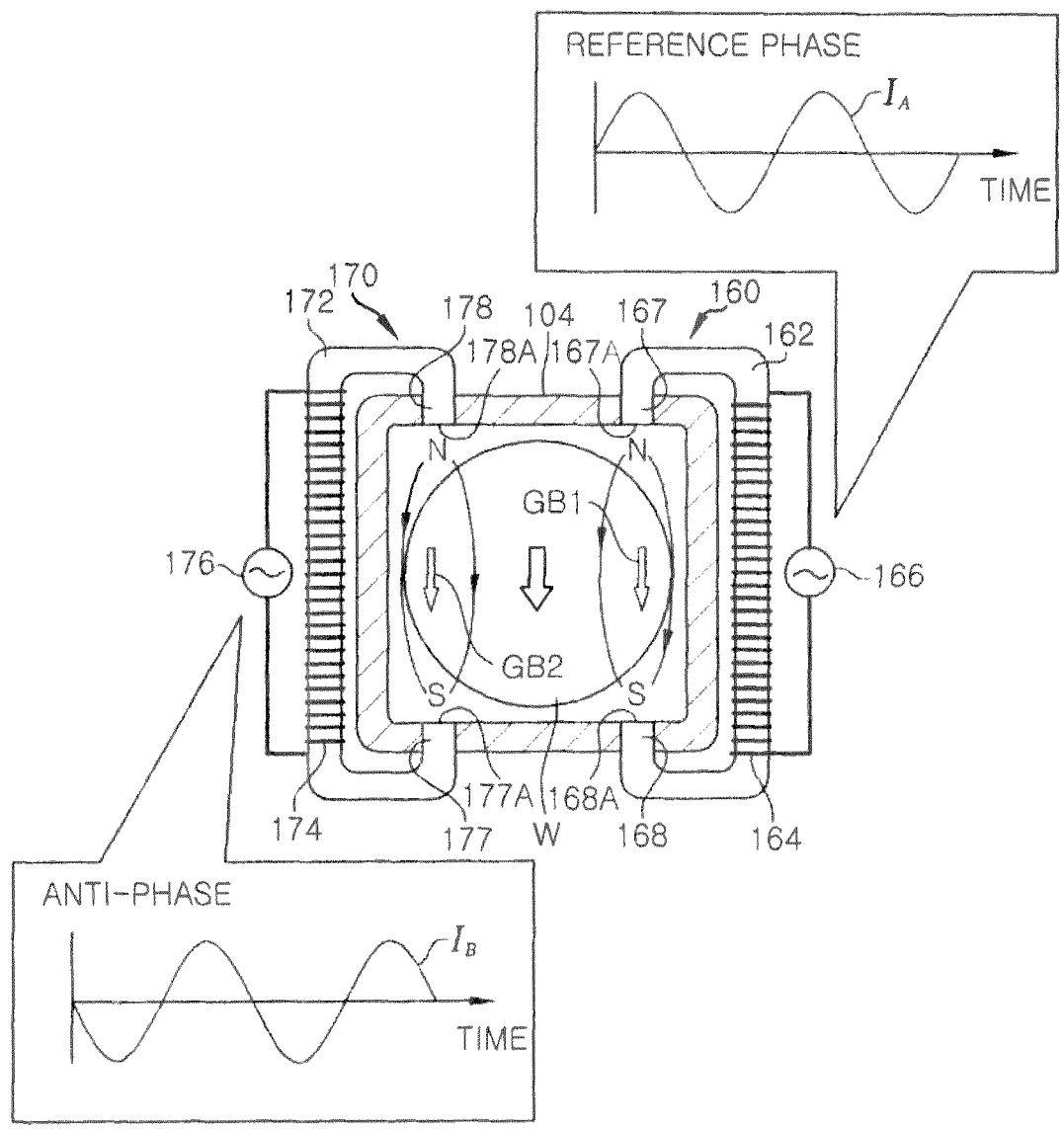
FIG. 9 represents an operation explanatory view schematically describing horizontal magnetic fields generated by the electromagnets shown in FIG. 7 in case when anti-phase AC currents being supplied to the electromagnets.

Hereinafter, the magnetic fields generated by the electromagnets 160 and 170 shown in FIG. 7 which are included in the magnetic field generating unit will be described with FIGS. 8 to 9. FIGS. 8 and 9 are operation explanatory views schematically showing horizontal magnetic fields generated by the magnetic field generating unit, which are top views of the electromagnets 160 and 170 shown in FIG. 4. FIG. 8 corresponding to FIG. 5 schematically shows a certain moment at which a horizontal magnetic field is generated by supplying in-phase AC currents to the electromagnets 160 and 170. FIG. 9 corresponding to FIG. 6 schematically shows a certain moment at which a horizontal magnetic field is generated by supplying anti-phase AC currents having the opposite phases to the electromagnets 160 and 170.

As described in FIG. 8, an in-phase AC current $I_A$ having the same magnitude as that of an AC current supplied from the AC power source 166 to the induction coil 164 of the electromagnet 160 is supplied to the induction coil 174 of the electromagnet 170. Then, at a certain moment, the magnetic poles 167 and 168 of the electromagnet 160 are respectively magnetized as an N-pole and an S-pole, and the magnetic poles 177 and 178 of the electromagnets 170 are respectively magnetized as an N-pole and an S-pole, as can be seen from FIG. 8.

Accordingly, horizontal magnetic fluxes are generated at the pole faces 167A and 168A of the electromagnet 160 and the pole faces 177A and 178A of the electromagnet 170, and this leads to generation of horizontal magnetic fields in the susceptors 112. In this case, the magnetic fluxes become mutually offset and thus weakened at the central portions of the wafers W, so that the horizontal magnetic fields also become weaker at the central portions than those at the peripheral portions.

For example, at the moment shown in FIG. 8, between the electromagnets 160 and 170, a magnetic flux GA1 flows from the pole face 167A serving as an N-pole toward the pole face 178A serving as an S-pole, and a magnetic flux GA2 flows from the pole face 177A serving as an N-pole toward the pole face 168A serving as an S-pole. The magnetic fluxes GA1 and GA2 become mutually offset and thus weakened since they flow in the reverse directions to each other at the central portions of the susceptors 112 (central portions of the wafer W). For that reason, the magnetic fields generated by the magnetic fluxes GA1 and GA2 become stronger at the peripheral portions of the susceptors 112 than those at the central portions of the susceptors 112.

Moreover, a magnetic flux GA3 flows from the pole face 167A as serving an N-pole flow toward the pole face 168A serving as an S-pole in the electromagnet 160, and a magnetic flux GA4 flows from the pole face 177A serving as an N-pole flows toward the pole face 178A serving as an S-pole in the electromagnet 170. The magnetic fluxes GA3 and GA4 become mutually offset and thus weakened since they flow in the reverse directions to each other at the central portions of the susceptors 112. Thus, the magnetic fields generated by the magnetic fluxes GA3 and GA4 become stronger at the peripheral portions of the susceptors 112 (peripheral portions of the wafers W) than those at the central portions of the susceptors 112.

Herein, the in-phase AC currents $I_A$ are supplied to the electromagnets 160 and 170, so that the polarities of the magnetic poles 167, 168, 177 and 178 are switched at the same timing. Hence, the directions of the magnetic fluxes GA1 to GA4 become reverse to those shown in FIG. 8 at another moment and, thus, the magnetic fluxes GA1 and GA3, and GA2, and GA4 become respectively mutually offset and thus weakened at the central portions of the susceptors 112. For that reason, the magnetic fields are constantly stronger at the peripheral portions of the susceptors 112 than those at the central portions of the susceptors 112.

Accordingly, when, e.g., the film forming process is performed on the wafers W, the film forming rate may be higher at the peripheral portions of the wafers W than at the central portions of the wafers W. Even when the temperatures of the susceptors 112 are lower at the peripheral portions than those at the central portions since an ambient temperature (e.g., sidewall temperature of the reaction tube 104) of the susceptors 112 is reduced, the heat generation rates at the peripheral portions of the susceptors 112 can be increased compared to those at the central portions of the susceptors 112 by supplying the in-phase AC currents to the electromagnets 160 and 170. As a result, the temperatures of the susceptors 112 can be made uniform over the central portions and the peripheral portions, which can improve the in-plane temperature uniformity of the wafers W.

On the other hand, as shown in FIG. 9, an anti-phase AC current $I_B$ having the same magnitude as that of an AC current $I_A$ supplied from the AC power source 166 to the induction coil 164 of the electromagnet 160 is supplied from the AC power source 176 to the induction coil 174 of the electromagnet 170. Hence, at a certain moment, the magnetic poles 167 and 168 of the electromagnet 160 are respectively magnetized as an N-pole and an S-pole, and the magnetic poles 177 and 178 of the electromagnets 170 are respectively magnetized as an S-pole and an N-pole, as depicted in FIG. 9.

Accordingly, horizontal magnetic fluxes are generated at the pole faces 167A and 168A of the electromagnet 160 and the pole faces 177A and 178A of the electromagnet 170, and this leads to generation of horizontal magnetic fields at the susceptors 112. In this case, the magnetic fluxes become mutually superposed and thus strengthened at the central portions of the wafers W, so that the horizontal magnetic fields also become strong at the central portions.

For example, at the moment shown in FIG. 9, a magnetic flux GB1 flows from the pole face 167A serving as an N-pole toward the pole face 168A serving as an S-pole in the electromagnet 160, and a magnetic flux GB2 flows from the pole face 178A serving as an N-pole toward the pole face 177A serving as an S-pole in the electromagnet 170. The magnetic fluxes GB1 and GB2 become mutually superposed and thus strengthened since they flow in the same direction at the central portions of the susceptors 112. Hence, the magnetic fields generated by the magnetic fluxes GB1 and GB2 also become strengthened at the central portions.

Herein, the anti-phase AC currents $I_A$ and $I_B$ are supplied to the electromagnets 160 and 170, so that the magnetic polarities of the magnetic poles 167, 168, 177 and 178 are switched at the same moment. Hence, the directions of the magnetic fluxes GB1 and GB2 become reverse to those shown in FIG. 9 at another moment and, thus, the magnetic fluxes GB1 and GB2 are constantly strong at the central portions of the susceptors 112. This makes the magnetic field stronger at the central portions of the susceptors 112 than at the peripheral portions of the susceptors 112. Accordingly, the heat generation rates at the central portions of the wafers W can be increased, and this can increase the temperatures of the central portions of the wafers W.

As such, as in the magnetic field forming unit shown in FIG. 4, the in-plane temperature distribution of the susceptors 112 can be varied by temporally switching the phases of the AC currents supplied to the electromagnets 160 and 170 shown in FIG. 7 from the same phase to the reverse phase or vise versa and thus changing the time ratio of in-phase current supply time and anti-phase current supply time.

Figure 10:
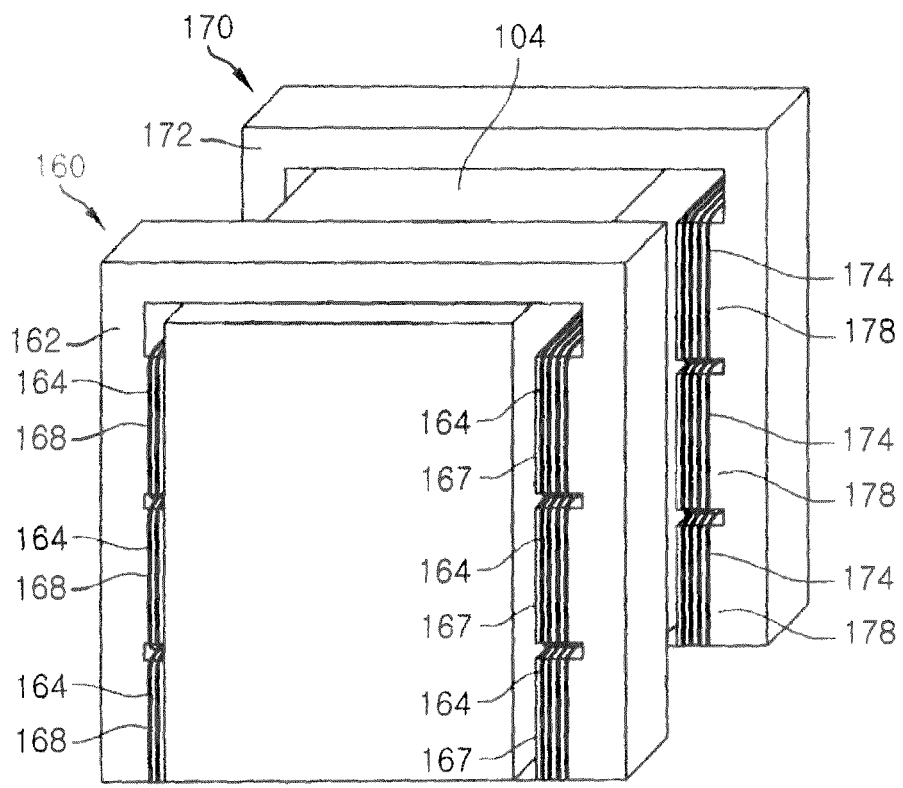
FIG. 10 is a schematic perspective view of another configuration example of the magnetic field generating unit shown in FIG. 7.

Further, as in the case described in FIG. 2, the pair of electromagnets 160 and 170 shown in FIG. 7 may be arranged in multiple stages (e.g., five stages). In that case, the cores 162 of the electromagnets 160 may be vertically connected to the ceiling of the reaction tube 104 extending thereover, and the cores 172 of the electromagnets 170 may be vertically connected to the ceiling of the reaction tube 104 extending thereover, as illustrated in FIG. 10.

Figure 11:
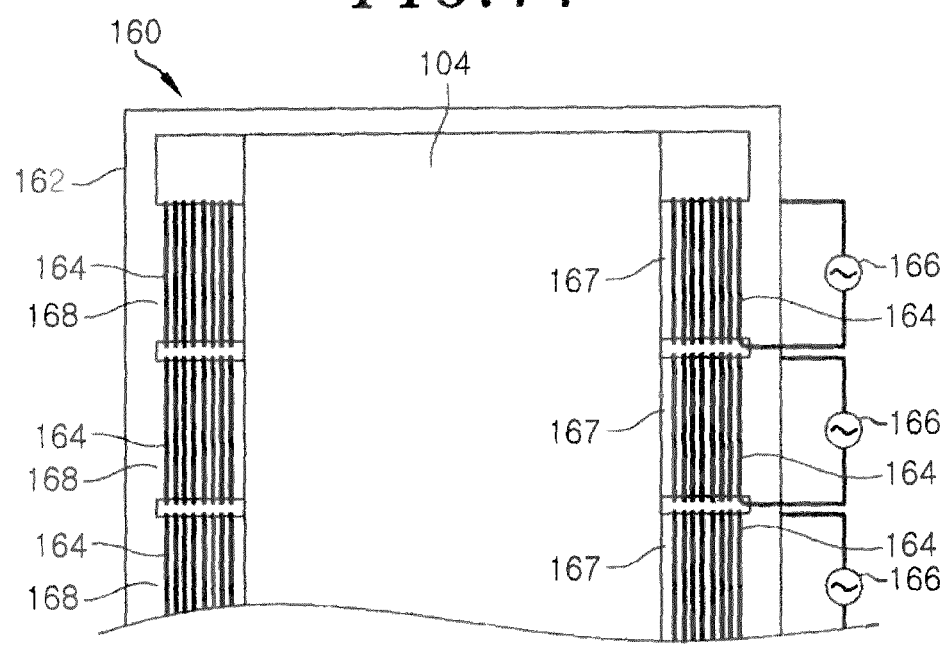
FIG. 11 explains one of the electromagnets shown in FIG. 10.
Figure 12:
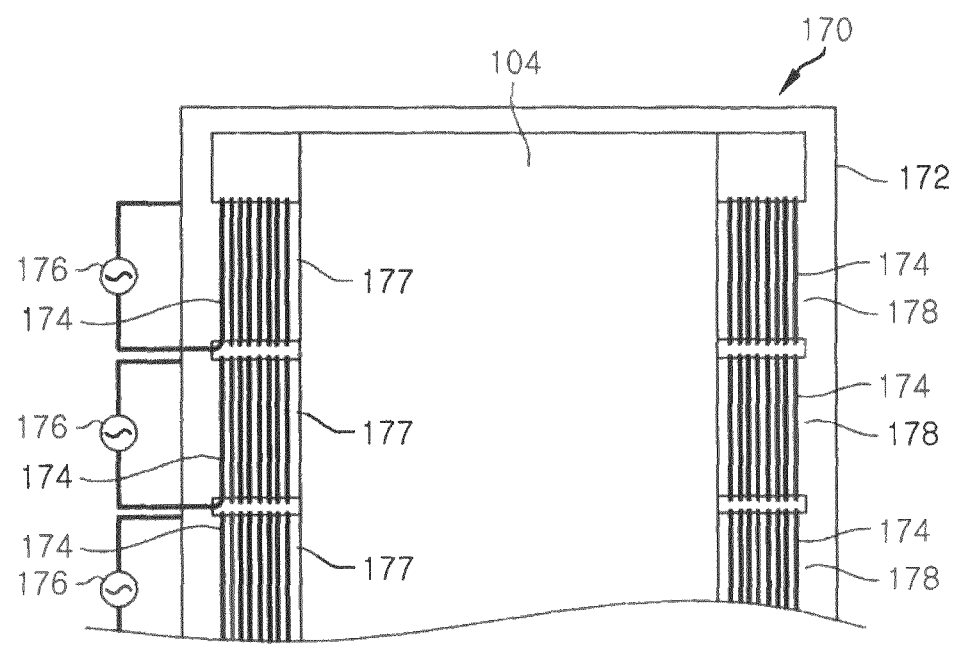
FIG. 12 explains the other one of the electromagnets shown in FIG. 10.

In that case, the AC power source 166 may be connected to the induction coil 164 wound around the magnetic poles 167 and 168 of the core 162 of the electromagnet 160, and the AC power source 176 may be connected to the induction coil 174 wound around the magnetic poles 177 and 178 of the core 172 of the electromagnet 170, as illustrated in FIGS. 11 and 12.

While the invention has been shown and described with respect to the embodiments, it will be understood by those skilled in the art that various changes and modification may be made without departing from the scope of the invention as defined in the following claims.

The present invention may be applied to a substrate processing apparatus for performing a predetermined process on a substrate, e.g., a semiconductor wafer, a glass substrate or the like.

What is claimed is:

1. A heat treatment apparatus comprising:
   a processing chamber which performs a predetermined process on a plurality of substrates;
   a plurality of susceptors made of a conductive material and each having a mounting surface for mounting the substrates;
   a rotatable susceptor supporting unit which supports the susceptors in the processing chamber, the susceptors being spaced apart from each other in a direction perpendicular to the mounting surfaces;
   a magnetic field generating unit, provided on a sidewall of the processing chamber, which inductively heats the susceptors by generating an AC magnetic field in a direction parallel to the mounting surfaces; and
   a control unit which controls the AC magnetic field generated by the magnetic field generating unit, wherein
   the magnetic field generating unit has a pair of electromagnets formed by winding induction coils around cores each having two magnetic poles, and AC power sources which independently apply AC currents to the induction coils of the electromagnets;
   the electromagnets are installed on a pair of opposite sidewalls of the processing chamber, and two pole faces of one of the electromagnets and two pole faces of the other electromagnet are separately arranged to face each other with peripheral portions of the susceptors therebetween; and
   the control unit independently controls the AC currents applied to the induction coils of the electromagnets by adjusting the AC power sources.

2. The apparatus of claim 1, wherein the control unit controls in-plane temperature distribution of the susceptors by switching control for supplying in-phase AC currents from the AC power sources to the electromagnets and control for supplying anti-phase AC currents from the AC power sources to the electromagnets.

3. The apparatus of claim 1, wherein the magnetic field generating unit is arranged in a plural number at multiple stages along an arrangement direction of the susceptors and the substrates.

4. The apparatus of claim 3, wherein the control unit controls each of the AC power sources of the magnetic field generating units independently.

5. The apparatus of claim 1, wherein the susceptors are made of graphite, and the sidewall of the processing chamber is made of a non-ferrous metal material.

6. The apparatus of claim 5, wherein the sidewall of the processing chamber is made of an aluminum-based non-ferrous metal material.

7. The apparatus of claim 1, wherein the cores of the electromagnets are made of a ceramic material.

8. The apparatus of claim 7, wherein the cores of the electromagnets are made of a ferrite-based ceramic material.

9. The apparatus of claim 1, further comprising a gas supply unit for supplying a processing gas into the processing chamber; and
a gas exhaust mechanism for vacuum-exhausting the processing chamber,
wherein the processing chamber performs a heat treatment on the substrates each having a metal film thereon or a heat treatment for forming a metal film on each of the substrates.

10. The apparatus of claim 1, wherein the magnetic field generating unit has a pair of electromagnets, each electromagnet includes a magnetic core formed as a single unit of two magnetic poles and an intermediate portion for connecting the magnetic poles, wherein an induction coil is wound around the intermediate portion.

11. A heat treatment apparatus comprising:
a processing chamber which performs a predetermined process on a plurality of substrates;
a plurality of susceptors made of a conductive material and each having a mounting surface for mounting the substrates;
a rotatable susceptor supporting unit which supports the susceptors in the processing chamber, the susceptors being spaced apart from each other in a direction perpendicular to the mounting surfaces;
a magnetic field generating unit, provided on a sidewall of the processing chamber, which inductively heats the susceptors by generating an AC magnetic field in a direction parallel to the mounting surfaces; and
a control unit which controls the AC magnetic field generated by the magnetic field generating unit, wherein
the magnetic field generating unit has a pair of electromagnets formed by winding induction coils around cores each having two magnetic poles, and AC power sources which independently apply AC currents to the induction coils of the electromagnets;
the electromagnets are provided to surround a pair of opposite sidewalls of the processing chamber, and two pole faces of each one of the electromagnets are respectively arranged to face each other with peripheral portions of the susceptors therebetween; and
the control unit independently controls the AC currents applied to the induction coils of the electromagnets by adjusting the AC power sources.

* * * * *